United States Patent
Goto

(12) 
(10) Patent No.: US 7,435,531 B2
(45) Date of Patent: Oct. 14, 2008

(54) IMAGE FORMING MATERIAL

(75) Inventor: Hidenori Goto, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 883 days.

(21) Appl. No.: 10/437,885

(22) Filed: May 15, 2003

(65) Prior Publication Data

US 2003/0215743 A1 Nov. 20, 2003

(30) Foreign Application Priority Data

May 20, 2002 (JP) .............................. 2002-144339

(51) Int. Cl.
*G03F 7/00* (2006.01)
*G03F 7/004* (2006.01)

(52) U.S. Cl. ............... 430/271.1; 430/270.1; 430/273.1

(58) Field of Classification Search ............. 430/271.1, 430/281.1, 270.1
See application file for complete search history.

(56) References Cited

U.S. PATENT DOCUMENTS

| | | | | |
|---|---|---|---|---|
| 4,822,713 | A * | 4/1989 | Nishioka et al. | 430/175 |
| 5,279,917 | A * | 1/1994 | Adachi et al. | 430/157 |
| 5,292,613 | A * | 3/1994 | Sato et al. | 430/257 |
| 5,340,685 | A * | 8/1994 | Sekiya | 430/175 |
| 5,747,216 | A * | 5/1998 | Watanabe et al. | 430/156 |
| 6,110,640 | A * | 8/2000 | Kawamura et al. | 430/270.1 |
| 6,132,931 | A * | 10/2000 | Kawamura et al. | 430/270.1 |
| 6,517,987 | B2 * | 2/2003 | Fujita et al. | 430/165 |
| 6,660,445 | B2 * | 12/2003 | Fujita et al. | 430/192 |
| 6,689,539 | B2 * | 2/2004 | Kamiya et al. | 430/287.1 |
| 6,709,800 | B2 * | 3/2004 | Fujita et al. | 430/270.1 |

FOREIGN PATENT DOCUMENTS

| | | |
|---|---|---|
| JP | B-8-3630 | 1/1996 |
| JP | 2.794.242 | 6/1998 |
| JP | A-2002-139830 | 5/2002 |

* cited by examiner

*Primary Examiner*—Amanda C. Walke
(74) *Attorney, Agent, or Firm*—Margaret A. Burke; Sheldon J. Moss

(57) ABSTRACT

The present invention relates to an image forming material in which at least an alkali-soluble thermoplastic resin layer and a photosensitive resin layer are formed on a support in this order. At least the thermoplastic resin layer of the image forming material includes a copolymer comprising monomers represented by the following general formula (a) and the following general formula (b), a content ratio by mass of the monomers represented by general formula (a) to the monomers represented by general formula (b) is in a specific range.

General formula (a)

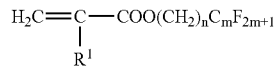

General formula (b)

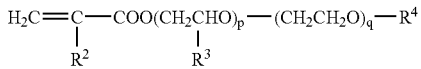

11 Claims, No Drawings

IMAGE FORMING MATERIAL

BACKGROUND OF THE INVENTION

1. Field of the Invention

The present invention relates to an image forming material that is advantageously used for an image formation by the use of a transferring process, such as a production of a color filter to be used for a manufacturing process of a color liquid-crystal display and the like.

2. Description of the Related Art

An image forming material, which is used for forming a photosensitive resin layer on a substrate serving as a body to be transferred, by transferring the photosensitive resin layer formed on a support onto the substrate, has been well known by, for example, Japanese Patent Application Publication (JP-B) No. 56-40824. This image forming material is used for manufacturing products such as printed circuits, intaglio/letterpress printing plates, name plates, multi-color trial print samples, offset printing plates and screen printing stenciles. The above-mentioned image forming material is normally constituted by a support, an intermediate layer (separation layer), optionally a thermoplastic resin layer, and a photosensitive resin layer. And in the case when an image is formed on the transferred body, the surface of the photosensitive resin layer of the image forming material is made in close-contact with the substrate serving as the body to be transferred. And after only the support has been separated therefrom, the transferred body is exposed through the intermediate layer, and further subjected to a developing process so that the image is formed on the substrate. In this case, the above-mentioned intermediate layer has a function for blocking oxygen, and is advantageously used for exposure in the air. Since its film is thin as having the thickness of 0.5 to 5 μm so that no adverse effects are particularly caused with respect to resolution. Moreover, the above-mentioned thermoplastic resin layer is allowed to absorb irregularities on the undercoat layer (that is, irregularities caused by the image that has been already formed).

For example, in general, a color filter, which is used for a color liquid crystal display and the like, has a basic structure in which respective pixels of R, G and B (red, green, blue) are formed and black matrixes (K) are formed between the gaps thereof so as to improve the display contrast and the like. The surfaces of these respective pixels of R, G and B and K in the color filter are required to have high smoothness. In other words, when an image is formed on the color-filter-use substrate surface by transferring a photosensitive resin layer thereon by the use of the above-mentioned image forming material, color irregularities tend to occur in the pixels unless not only the photosensitive resin layer, but also thermoplastic resin layer has superior smoothness (that is, when there are irregularities in the film thickness). In the case when a color liquid crystal display is manufactured by using such a color filter having color irregularities, with respect to pixels obtained for use in the color liquid crystal display, a coating process needs to be carried out in a manner so as not to cause coating irregularities and cissing during the coating process, in order to prevent generation of color irregularities.

In order to solve such problems, JP-B No. 8-3630 has proposed a method in which, upon applying and forming a photosensitive resin layer, a fluorine-based surfactant is added to the coating solution. With respect to the fluorine-based surfactant, a copolymer between acrylate or methacrylate having a fluoro aliphatic group that has 3 to 20 carbon atoms and fluorine atoms of not less than 40% by mass, with hydrogen atoms bonded to at least three carbon atoms at the end terminal being substituted by fluorine atoms; and poly(oxyalkylene) acrylate or poly(oxyalkylene) methacrylate, which contains acrylate or methacrylate units having the fluoro aliphatic group in a range of 40 to 70% by mass in the copolymer, is used. With respect to fluorine-based surfactants used in a number of examples, those in which the oxyalkylene of poly(oxyalkylene) (metha)acrylate is oxyethylene, oxytriethylene or oxytetramethylene are adopted, and most of them have a weight average molecular weight of approximately 15,000.

Some of the above-mentioned fluorine-based surfactants used in examples of JP-B No. 8-3630 make it possible to smooth the surface of the photosensitive resin layer. However, these are still insufficient in adhesive property to the substrate, and, in particular, fail to provide a sufficient adhesive property to the substrate upon carrying out a transferring process onto a glass substrate and a substrate bearing semiconductors. Moreover, this document does not disclose anything about smoothness on the thermoplastic resin layer.

Moreover, in recent years, there have been strong demands for a high-speed transferring property from the viewpoint of cost reduction, and in the case when certain irregularities exist on a substrate to be transferred, upon carrying out the high-speed transferring process of a very thin photopolymerizable layer thereon, a problem is raised in which bubbles and the like are included between the photopolymerizable layer and the substrate to cause a defective transferring process.

For example, upon producing a multi-color image such as a color-filter forming process, this problem occurs when the second color photosensitive resin layer is formed on the first color pixel. Further, in the case when, upon producing a printed substrate and the like, fine scratches and dents exist on a copper surface of a copper-clad laminate due to a surface smoothing process, this problem occurs when a dry film resist layer is transferred thereon.

Japanese Patent Application Laid-Open (JP-A) No. 63-309946 has disclosed the fact that since fine irregularities on a permanent support or particles of fine contaminant and dusts on the permanent support or the transferring layer or both of these interfere with sufficient adhesion of the transferring layer to the permanent support, a detective transferring tends to occur, and the application of a temporary support having a compressing property in order to prevent this undesired defective adhesion. Although this method is certainly effective, it is not sufficient in transferring a non-adhesive photosensitive resin layer onto a permanent support having irregularities that have the similar thickness as the thickness of the layer at room temperature, without causing bubbles thereon.

Japanese Patent No. 2794242 has disclosed an image forming material in which an alkali-soluble thermoplastic resin layer, an intermediate layer and a photosensitive resin layer are formed on a temporary support in this order. However, in the case when, in order to increase the transferring speed, a flexible material is used for the resin to form the alkali-soluble thermoplastic resin layer or when a great amount of plasticizer is added, a phenomenon (hereinafter, referred to as reticulation) occurs in which fine wrinkles are generated on the intermediate layer upon forming the alkali-soluble thermoplastic resin layer and the intermediate layer on the temporary support, causing irregularities to remain on the surface. The reticulation causes a problem in which smoothness in the photosensitive resin layer applied onto the intermediate layer is interrupted. For this reason, it has been difficult to achieve both of the high-speed transferring property and the prevention of reticulation. Moreover, the developing process tends to fail to sufficiently dissolve the plasticizer in the developer, with the result that troubles in transporting solution, such as pipe clogging in the developing vessel, tend to occur frequently.

SUMMARY OF THE INVENTION

An object of the present invention is to provide an image forming material that achieves a smooth coat surface with an even layer thickness, without coating irregularities, color irregularities, cissing and pinholes, and is superior in contact characteristics with glass substrate. Moreover, another object is to provide an image forming material which, upon transferring a photosensitive resin layer of the image forming material from a temporary support to a permanent support, allows the temporary support to carry out the transferring process at high speeds without causing a defective transferring (generation of bubbles) due to differences in level or the like caused by scratches on the permanent support and the above-mentioned proceeding pixels.

In order to solve the above-mentioned problems, a first aspect of the invention provides an image forming material, comprising: at least an alkali-soluble thermoplastic resin layer and a coating layer made of a photosensitive resin layer are formed on a support in this order, wherein at least the thermoplastic resin layer contains monomers represented by the following general formula (a) and general formula (b), with the monomers forming a copolymer having a mass ratio of monomers represented by general formula (a)/monomers represented by general formula (b) from 20/80 to 60/40.

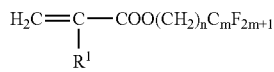

General formula (a)

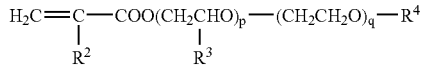

General formula (b)

In the general formula, each of $R^1$, $R^2$ and $R^3$ represents a hydrogen atom or a methyl group independently and $R^4$ represents a hydrogen atom or an alkyl group having 1 to 5 carbon atoms. Here, n represents an integer of 1 to 18, and m represents an integer of 2 to 14. Further, each of p and q represents an integer of 0 to 18, though p and q cannot both be 0 simultaneously.

The first aspect of the invention provides an image forming material (V) comprising at least an alkali-soluble thermoplastic resin layer and a photosensitive resin layer, which are coated on a support in this order, wherein the image forming material includes, in at least the thermoplastic resin layer, a copolymer comprising a monomer represented by the general formula (a) and a monomer represented by the general formula (b), a content ratio by mass of the monomer represented by the general formula (a) to the monomer represented by the general formula (b) is from 20/80 to 60/40.

The second aspect of the invention provides a image forming material (W), which image forming material is the same as the image forming material (V) except that the copolymer is further included in the photosensitive resin layer.

The third aspect of the invention provides the image forming material (V), wherein a mass of the $C_mF_{2m+1}$ in the general formula (a) is in a range of 20 to 70% by mass with respect to the mass of the monomer represented by the general formula (a).

The fourth aspect of the invention provides the image forming material (W), wherein a mass of the $C_mF_{2m+1}$ in the general formula (a) is in a range of 20 to 70% by mass with respect to the mass of the monomer represented by the general formula (a).

The fifth aspect of the invention provides the image forming material (V), wherein m in the general formula (a) is in a range of 4 to 12.

The sixth aspect of the invention provides the image forming material (W), wherein m in the general formula (a) is in a range of 4 to 12.

The seventh aspect of the invention provides the image forming material (V), wherein n in the general formula (a) is in a range of 2 to 10.

The eighth aspect of the invention provides the image forming material (W), wherein n in the general formula (a) is in a range of 2 to 10.

The ninth aspect of the invention provides the image forming material (V), wherein each of p and q in the general formula (b) is in a range of 2 to 8.

The tenth aspect of the invention provides the image forming material (W), wherein each of p and q in the general formula (b) is in a range of 2 to 8.

The eleventh aspect of the invention provides the image forming material (V), wherein a weight average molecular weight Mw of the copolymer is in a range of 1000 to 40000.

The twelfth aspect of the invention provides the image forming material (W), wherein the weight average molecular weight Mw of the copolymer is in a range of 1000 to 40000.

The thirteenth aspect of the invention provides the image forming material (V), wherein at least 2 types of monomers, different in at least one of molecular structure and monomer composition, are mixed and included in the copolymer.

The fourteenth aspect of the invention provides the image forming material (W), wherein at least 2 types of monomers, different in at least one of molecular structure and monomer composition, are mixed and included in the copolymer.

The fifteenth aspect of the invention provides the image forming material (V), wherein a vinyl-based monomer other than the monomer represented by the general formula (a) and the general formula (b) is included in the copolymer.

The sixteenth aspect of the invention provides the image forming material (W), wherein a vinyl-based monomer other than the monomer represented by the general formula (a) and the general formula (b) is included in the copolymer.

The seventeenth aspect of the invention provides the image forming material (V), wherein the content of the copolymer is in a range of 0.01 to 10% by mass with respect to a total layer solids content of one of the thermoplastic resin layer and the photosensitive resin layer.

The eighteenth aspect of the invention provides the image forming material (W), wherein the content of the copolymer is in a range of 0.01 to 10% by mass with respect to a total layer solid content of one of the thermoplastic resin layer or the photosensitive resin layer.

The nineteenth aspect of the invention provides the image forming material (V), wherein a vinyl-based monomer other than the monomer represented by the general formula (a) and the general formula (b) is included in the copolymer, and in the copolymer, the monomer represented by the general formula (a) occupies a range of 20 to 60% by mass, the monomer represented by the general formula (b) occupies a range of 80 to 40% by mass, and the vinyl-based monomer occupies the rest.

The twentieth aspect of the invention provides the image forming material (W), wherein a vinyl-based monomer other than the monomer represented by the general formula (a) and the general formula (b) is included in the copolymer, and in the copolymer, the monomer represented by the general formula (a) occupies a range of 20 to 60% by mass, the monomer represented by the general formula (b) occupies a range of 80 to 40% by mass, and the vinyl-based monomer occupies the rest.

DESCRIPTION OF THE PREFERRED EMBODIMENTS

The image forming material of the present invention has an arrangement in which at least an alkali-soluble thermoplastic resin layer (hereinafter, simply referred to as a thermoplastic resin layer) comprises a copolymer composed of monomers represented by the above-mentioned general formula (a) and general formula (b). The copolymer has a surface-active property so that, in the following description, it is referred to as a surfactant of the invention.

Image Forming Material

The image forming material of the present invention is designed so that at least a photosensitive resin layer is transferred on a surface of a desired member. The surface of the predetermined member is also referred to as a base layer surface. The image forming material of the invention comprises the surfactant of the invention in its thermoplastic resin layer so that it is possible to improve the coating property of the thermoplastic resin layer. The thermoplastic resin layer comprising the surfactant of the invention has a smooth coat surface with an even layer thickness, superior antifoaming property, and superior contact characteristics with a base-layer surface, without coating irregularities, color irregularities, and bubble generation. In particular, the thermoplastic resin layer has a superior contact characteristics with a substrate having, as the base layer, a glass substrate or substrate with semiconductors. In the invention, the photosensitive resin layer is used for an image formation, and the resultant image includes a colorless transparent image. In the case when a colored image is to be obtained, a coloring agent is contained in the layer.

Surfactant

The surfactant of the invention contains a copolymer having monomers represented by the following formulae (a) and (b).

The following description will discuss the surfactant of the invention.

General formula (a)

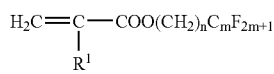

General formula (b)

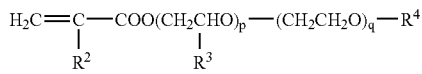

In the surfactant of the invention, the monomer represented by general formula (a) is referred to as monomer (a) and the monomer represented by general formula (b) is referred to as monomer (b).

The following description will discuss monomer (a):

In general formula (a), $C_mF_{2m+1}$ may be a linear chain or a branched chain. Here, m represents an integer of 2 to 14, more preferably, 4 to 12. The content of $C_mF_{2m+1}$ is preferably set in a range of 20 to 70% by mass with respect to monomer (a), more preferably, 40 to 60% by mass. $R^1$ represents a hydrogen atom or a methyl base. Moreover, n indicates an integer of 1 to 18, more preferably, 2 to 10.

The following description will discuss monomer (b).

In general formula (b), each of $R^2$ and $R^3$ represents a hydrogen atom or a methyl group independently and $R^4$ represents a hydrogen atom or an alkyl group having 1 to 5 carbon atoms. Here, each of p and q represents an integer of 0 to 18, p and q cannot both be 0 simultaneously. Each of p and q is preferably 2 to 8.

With respect to the monomer (a) contained in one molecular of the surfactant of the invention, either monomers having the same structure or monomers having different structure may be used. The same is true for monomer (b).

The weight average molecular weight Mw of the surfactant of the invention is preferably in a range of 1000 to 40000, more preferably, 5000 to 20000.

The surfactant of the invention includes monomers represented by the above-mentioned general formula (a) and general formula (b), and the copolymer composed of the monomers has a mass ratio of general formula (a)/general formula (b) in a range of 20/80 to 60/40.

In 100 parts by mass of the surfactant of the invention, the content of monomer (a) is preferably 20 to 60 parts by mass, with the content of monomer (b) being 80 to 40 parts by mass and other desired monomers accounting for the rest of the parts by mass. More preferably, the content of monomer (a) is preferably 25 to 60 parts by mass, with the content of monomer (b) being 60 to 40 parts by mass and other desired monomers accounting for the rest of the parts by mass.

With respect to copolymerizable monomers other than monomers (a) and (b), examples thereof include styrene, its derivatives and its substituted compounds, such as styrene, vinyl toluene, α-methylstyrene, 2-methylstyrene, chlorostyrene, vinyl benzoate, sodium vinylbenzene sulfonate and amino styrene; and dienes such as butadiene and isoprene; vinyl-based monomers, such as acrylonitrile, vinyl ethers, methacrylic acid, acrylic acid, itaconic acid, crotonic acid, maleic acid, partially esterified maleic acid, styrene sulfonic acid maleic anhydride, cinnamic acid, vinyl chloride and vinyl acetate.

The surfactant of the invention is a copolymer of monomer (a), monomer (b), etc., and the monomer pattern is not particularly limited and it can be random or regular patterns, such as a block or graft polymer, may be adopted.

Moreover, the surfactant of the invention may be formed by mixing two or more monomers different in at least one of molecular structure and monomer composition.

The content of the surfactant of the invention is preferably in a range of 0.01 to 10% by mass with respect to the entire layer solids content of the thermoplastic resin layer or the photosensitive resin layer, more preferably, 0.1 to 6% by mass. It is more effective to use the surfactant of the invention for both of the thermoplastic resin layer and photosensitive resin layer.

The surfactant of the invention is characterized by comprising a surfactant having a specific structure, an ethylene oxide group. The surfactant of the invention, comprised in a thermoplastic resin layer in the specific amount, improves the coating property and the transferring property of the thermoplastic resin layer.

Image Forming Material

The coating layer composition of the image forming material of the invention, is not particularly limited as long as the composition comprises at least the above-mentioned thermoplastic resin layer and the photosensitive resin layer. In general, the layer composition of the image forming material has an arrangement in which an alkali-soluble thermoplastic resin layer, an oxygen-blocking layer and a photosensitive resin layer are formed on a support in succession. In the image forming material of the invention, the surfactant of the invention is comprised in the alkali-soluble thermoplastic resin layer.

Support

The support is preferably composed of a flexible substance that has a superior separating property from an alkali-soluble thermoplastic resin layer, and is stable chemically as well as thermally. More specifically, examples thereof include thin sheets of Teflon (R), polyethylene terephthalate (PET), polycarbonate, polyethylene and polypropylene or laminated products thereof.

In general, in order to provide a superior separating property between the support and the thermoplastic resin layer, neither a surface treatment such as glow discharging is carried out, nor an undercoat layer such as gelatin is applied. The thickness of the support is preferably in a range of 5 to 300 µm, more preferably, 20 to 150 µm.

Thermoplastic Resin Layer

The thermoplastic resin layer that is alkali-soluble also serves as a cushion member so as to absorb irregularities (including irregularities due to an image or the like that has been already formed) on the undercoat layer surface. Therefore, the thermoplastic resin layer preferably has a deformable property in accordance with the irregularities.

At least one of the resin contained in the alkali-soluble thermoplastic resin layer is preferably selected from the group consisting of a saponificated compound of an ethylene-acrylic acid ester copolymer, a saponificated compound of a styrene-(metha) acrylic acid ester copolymer, a saponificated compound of a vinyl toluene-(metha) acrylic acid ester copolymer, poly(metha)acrylic acid ester, a saponificated compound of a (metha)acrylate copolymer between (metha) butyl acrylate and vinyl acetate, and the like. Among organic polymers described in "Plastic Performance Handbook" (written and edited by All Japan Association of Plastic Molding Industry, Japan Federation of Plastic Industry, issued by Kogyo Chosakai Co., Ltd. on Oct. 25, 1968), those soluble in an alkali aqueous solution may be used. Moreover, among these thermoplastic resins, those having a softening point of not more than 80° C. are preferably used. Here, in the specification of the invention, "(metha)acrylic acids" refer to both acrylic acid and methacrylic acid, and the same is true for the derivatives thereof.

Among these resins, resins having weight average molecular weights in a range of of 50,000 to 500,000 (Tg=0 to 140° C.) are preferable, and more preferably, weight average molecular weight in a range of 60,000 to 200,000 (Tg=30 to 110° C.). Specific examples of the resin include those resins that are soluble in an alkali aqueous solution, and described in specifications in JP-B Nos. 54-34327, 55-38961, 58-12577, 54-25957, JP-A No. 61-134756, JP-B No. 59-44615, JP-A Nos. 54-92723, 54-99418, 54-137085, 57-20732, 58-93046, 59-97135, 60-159743, OLS No. 3504254, JP-A Nos. 60-247638, 60-208748, 60-214354, 60-230135, 60-258539, 61-169829, 61-213213, 63-147159, 63-213837, 63-266448, 64-55551, 64-55550, 2-191955, 2-199403, 2-199404, 2-208602 and Japanese Patent Application No. 4-39653. In particular, a copolymer of methacrylic acid/2-ethylhexyl acrylate/benzyl methacrylate/methyl methacrylate, disclosed in the specification of JP-A No. 63-147159, is preferably used.

Moreover, among the above-mentioned various resins, resins having weight average molecular weights in a range of 3,000 to 30,000 (Tg=30 to 170° C.) are preferably selected, more preferably, weight average molecular weights in a range of 4,000 to 20,000 (Tg=60 to 140° C.). Preferably, specific examples are selected from those described in the above-mentioned patent specifications, and, in particular, a styrene/(metha)acrylate copolymer, disclosed in JP-B No. 55-38961 and JP-A No. 5-241340, is preferably used.

Moreover, in order to adjust the adhesive force to the support, to these organic polymer substances are added various plasticizers, various polymers and supercooling substances, adherence-improving agents or surfactants, and mold-releasing agents and the like. Specific examples of preferable plasticizers include: polypropylene glycol, polyethylene glycol, dioctyl phthalate, diheptyl phthalate, dibutyl phthalate, tricresyl phosphate, cresyl diphenyl phosphate, biphenyl diphenyl phosphate, polyethylene glycol mono(metha)acrylate, polyethylene glycol di(metha)acrylate, polypropylene glycol mono(metha)acrylate, polypropylene glycol di(metha)acrylate, an addition reactant between epoxy resin and polyethylene glycol mono(metha)acrylate, an addition reactant between organic diisocyanate and polyethylene glycol mono(metha)acrylate, an addition reactant between organic diisocyanate and polypropylene glycol mono(metha)acrylate, and a condensation reactant between bisphenol A and polyethylene glycol mono(metha)acrylate. The amount of the plasticizer in the alkali-soluble thermoplastic resin layer is generally set to not more than 200% by mass, more preferably, 20 to 100% by mass, with respect to the thermoplastic resin. The thickness of the alkali-soluble thermoplastic resin layer is preferably set to not less than 6 µm. When the thickness of the thermoplastic resin is not less than 6 µm, it is possible to completely absorb irregularities on the surface of the base layer. Moreover, with respect to the upper limit, it is generally set to approximately not more than 100 µm, more preferably, approximately not more than 50 µm, from the viewpoint of appropriate developing property and manufacturing applicability.

Oxygen Blocking Layer

An oxygen-blocking layer is a layer having a property for blocking oxygen, and this layer allows the photosensitive resin layer to be polymerized by exposure without the intervention with polymerization by oxygen even in the air. Further, since the film thickness is thin (approximately, 0.05 to 5 µm), no adverse effects are given to the resolution. With respect to the composition of the oxygen-blocking layer, any known material may be used as long as it is dispersed or dissolved in water or an alkali aqueous solution to exhibit a low oxygen transmission rate. For example, a polyvinyl ether/maleic anhydride polymer, a water-soluble salt of carboxy alkyl cellulose, water-soluble cellulose ethers, a water-soluble salt of carboxy alkyl starch, polyvinyl alcohol, polyvinyl pyrrolidone, various polyacryl amides, various water-soluble polyamides, a water-soluble salt of polyacrylic acid, a water-soluble salt of any of gelatin, ethylene oxide polymer, various starches and analogues thereof, a copolymer of styrene/maleic acid, polymer of maleic acid half ester and combinations of two or more of these, which are described in JP-A No. 46-2121 and JP-B No. 56-40824.

In particular, a combination of polyvinyl alcohol and polyvinyl pyrrolidone is preferably used. With respect to the polyvinyl alcohols, those having a saponification rate of not less than 80% are preferably used, and the content of polyvinyl pyrrolidone is generally set to 1 to 75% by mass on the basis of the solids content of the oxygen blocking layer, more preferably, 1 to 60% by mass, most preferably, 10 to 50% by mass. The content of less than 1% by mass fails to provide a sufficient adhesive property to the photosensitive resin layer, while the content exceeding 75% by mass causes degradation in the oxygen blocking function. The thickness of the oxygen-blocking layer is preferably set to a very small level of approximately 0.1 to 5 µm, more preferably, 0.5 to 2 µm. In a range of approximately 0.1 to 5 µm, the oxygen transmission rate is not too high, and it is possible to prevent the time required for the developing process or the oxygen-blocking layer removing process from becoming too long.

Photosensitive Resin Layer

The photosensitive resin layer has two types, that is, one that can be developed by an alkali aqueous solution and the other that can be developed by an organic solvent. From the viewpoint of safety and cost reduction in the developer, the layer that can be developed by an alkali aqueous solution is preferably used.

The photosensitive resin can be a negative type resin that is cured at portions that receive irradiation of light, electron beam or the like, or a positive type resin that is cured at portions that do not receive irradiation.

Examples of the positive type photosensitive resin include novolak-based resins. For example, alkali-soluble novolak resins disclosed in JP-A No. 7-43899 may be used. Moreover, there can be used a positive type photosensitive resin layer disclosed in JP-A No. 6-148888, that is, a photosensitive resin layer comprising the alkali-soluble resin disclosed in the Patent Document, 1,2-naphthoquinone diazidesulfonate serving as a photosensitive agent and a mixture of a heat-curing agent disclosed in the Patent Document. Moreover, compositions disclosed in JP-A No. 5-262850 may also be used.

With respect to the negative type photosensitive resin, examples thereof include a photosensitive resin made from a negative type diazo resin and a binder, a photo-polymerizable composition, a photosensitive resin composition made from an azide compound and a binder, and a cinnamic-acid based photosensitive resin composition. Among these, a photosensitive resin, which contains a photo-polymerization initiator, a photo-polymerizable monomer and a binder as basic composition elements, is most preferably used. With respect to the photosensitive resin layer, "polymerizable composition B", "polymerization initiator C", "surfactants" and "adhesion assistant agent", etc., disclosed in JP-A No. 11-133600, may be used.

For example, a negative type photosensitive resin that can also be developed in an alkali aqueous solution contains a carboxylic-acid group containing binder (the above-mentioned alkali-soluble thermoplastic resin, etc.), an ethylene-based unsaturated double-bond containing monomer that is addition-polymerizable by light irradiation, and a photo-polymerization initiator, as main components.

With respect to the alkali-soluble binder, examples thereof include a polymer having a carboxylic acid group on its side chain, such as a methacrylic acid copolymer, an acrylic acid copolymer, an itaconic acid copolymer, a crotonic acid copolymer, a maleic acid copolymer and a partially esterified maleic acid copolymer, disclosed in JP-A No. 59-44615, JP-B Nos. 54-34327, 58-12577, 54-25957, JP-A Nos. 59-53836 and 59-71048. Moreover, cellulose derivatives having a carboxylic acid group on the side chain thereof may also be used. In addition to these, polymers having a hydroxide group to which a cyclic acid anhydride is added may be preferably used. In particular, a copolymer of benzyl (metha) acrylate and (metha)acrylic acid, and a multi-component copolymer of benzyl (metha)acrylate, (metha)acrylic acid and another monomer, disclosed in U.S. Pat. No. 4,139,391, may be used.

With respect to the alkali-soluble binder to be used for the photosensitive resin layer, those having an acid value of 30 to 400 mg KOH/g with a weight average molecular weight in a range of 1000 to 300,000 are selected and used. In addition to these, alkali-insoluble polymers may be added so as to improve various functions, such as a function for improving the strength of a cured layer, within an amount that causes no adverse effects on the developing property and the like. Among these polymers, alcohol soluble nylon or epoxy resin may be cited as examples.

The content of the alkali-soluble binder is normally 10 to 95% by mass, more preferably, 20 to 90% by mass, with respect to the entire solids content of the photosensitive resin composition. The binder comprised in an amount of 10 to 95% by mass neither makes the viscosity of the photosensitive resin layer too high, nor causes degradation in the strength and light sensitivity of the layer to be formed.

As the photo-polymerization initiator, examples thereof include: vicinal polyketal donyl compound disclosed in U.S. Pat. No. 2,367,660, an acyloin ether compound disclosed in U.S. Pat. No. 2,448,828 and an aromatic acyloin compound substituted by α-hydrocarbon disclosed in U.S. Pat. No. 2,722,512, a polynuclear quinone compound disclosed in the respective specifications of U.S. Pat. Nos. 3,046,127 and 2,951,758, a combination of a triaryl imidazole dimer and p-amino ketone disclosed in U.S. Pat. No. 3,549,367, a benzothiazole compound and a trihalomethyl-s-triazine compound disclosed in JP-B No. 51-48516, a trihalomethyl-s-triazine compound disclosed in the specification of U.S. Pat. No. 4,239,850, and a trihalomethyl oxadiazole compound disclosed in U.S. Pat. No. 4,212,976. More preferably, trihalomethyl-s-triazine, trihalomethyl oxadiazole and a triaryl imidazole dimer are used.

In the photosensitive resin layer, the content of the photo-polymerization initiator with respect to the entire solids content is generally set in a range of 0.5 to 20% by mass, more preferably, 1 to 15% by mass. The content less than 0.5% by mass causes degradation in the photosensitivity and the image intensity, while the addition exceeding 20% by mass fails to improve performances.

With respect to the ethylenic unsaturated-double-bond containing monomer that is addition-polymerized by light irradiation, those compounds having a boiling point of not less than 100° C. at normal pressure are listed. Examples thereof include: monofunctional(metha)acrylate such as polyethylene glycol mono(metha)acrylate, polypropylene glycol mono(metha)acrylate and phenoxy ethyl(metha)acrylate; and polyfunctional (metha)acrylates such as those prepared by converting polyfunctional alcohols, to which ethylene oxide and propylene oxide have been added, into (metha) acrylates. Example of the polyfunctional alcohols include polyethylene glycol di(metha)acrylate, polypropylene glycol di(metha)acrylate, trimethylol ethane triacrylate, trimethylol propane triacrylate, trimethylol propane diacrylate, neopentyl glycol di(metha)acrylate, pentaerythritol tetra(metha)acrylate, pentaerythritol tri(metha)acrylate, dipentaerythritol hexa(metha)acrylate, dipentaerythritol penta(metha)acrylate, hexane diol di(metha)acrylate, trimethylol propane tri (acryloyloxypropyl) ether, tri(acryloyloxyethyl) isocyanurate, tri(acryloyloxyethyl) cyanurate, glycerin tri(metha) acrylate, trimethylol propane or glycerin.

Moreover, examples thereof further include: polyfunctional acrylates and methacrylates such as urethane acrylates disclosed in JP-B Nos. 48-41708 and 50-6034 and JP-A No.

51-37193, and polyester acrylates and epoxy acrylates that are reactants between epoxy resins and (metha)acrylic acids disclosed in JP-A No. 48-64183, JP-B Nos. 49-43191 and 52-30490. Among these, preferable examples include: trimethylol propane tri(metha)acrylate, pentaerythritol tetra (metha)acrylate, dipentaerythritol hexa(metha)acrylate and dipentaerythritol penta(metha)acrylate. These monomers may be used alone or two kinds or more of these may be used in combination. The content of the monomers on the basis of the entire solids content of the photosensitive resin composition is generally 5 to 50% by mass, preferably, 10 to 40% by mass. The monomers comprised in an amount of 5 to 50% by mass on the basis of the entire solids content of the photosensitive resin composition, causes neither degradation in the photosensitivity and image intensity, nor excessive stickiness in the photosensitive resin layer.

The photosensitive resin layer contains at least a pigment or a dye so as to form a colored image on the transferred body.

The pigment is generally classified to organic pigments and inorganic pigments, and the former is superior in transparency of the coated film, while the latter is generally superior in masking property. Therefore, these are appropriately selected depending on applications. In addition to these, metal powder, metal oxide powder, fluorescent pigments, etc. may be used in some cases. Preferable examples of the pigments include: azo-based pigments, phthalocyanine-based pigments, anthraquinone-based pigments, dioxazine-based pigments, quinacridone-based pigments, isoindolinone-based pigments and nitro-based pigments. Pigments to be used in the photosensitive resin layer are listed below in a separated manner based upon hues. However, the invention is by no means limited by these examples. These pigments and dyes may be used alone or a plurality of them may be used in combination.

1) Red Pigments

Organic pigments, such as C.I. Pigment Red 97, C.I. Pigment Red 122, C.I. Pigment Red 149, C.I. Pigment Red 168, C.I. Pigment Red 177, C.I. Pigment Red 180, C.I. Pigment Red 192, C.I. Pigment Red 215, C.I. No. 12085, C.I. No. 12120, C.I. No. 12140 and C.I. No. 12315.

2) Green Pigments

Organic pigments, such as C.I. Pigment Green 7, C.I. Pigment Green 36, C.I. No. 42053, C.I. No. 42085 and C.I. No. 42095.

3) Blue Pigments

Organic pigments, such as C.I. Pigment Blue 15:1, C.I. Pigment Blue 15:4, C.I. Pigment Blue 15:6, C.I. Pigment Blue 22, C.I. Pigment Blue 60, C.I. Pigment Blue 64, C.I. No. 42052 and C.I. No.42090.

4) Yellow Pigments

Pigment Yellow 12 (C.I. No. 21090)

Examples) Permanent Yellow DHG (made by Clariant (Japan) K.K.), Lionol Yellow 1212B (made by TOYO INK MFG. Co., Ltd.), Irgalite Yellow LCT (made by Ciba Specialty Chemicals Inc.), Symuler Fast Yellow GTF 219 (made by Dainippon Ink and Chemicals, Incorporated).

Pigment Yellow 13 (C.I. No. 21100)

Examples) Permanent Yellow GR (made by Clariant (Japan) K.K.), Lionol Yellow 1313 (made by TOYO INK MFG. Co., Ltd.). Pigment Yellow 14 (C.I. No. 21095)

Examples) Permanent Yellow G (made by Clariant (Japan) K.K.), Lionol Yellow 1401-G (made by TOYO INK MFG. Co., Ltd.), Seika Fast Yellow 2270 (made by Dainichiseika Color & Chemicals Mfg. Co., Ltd.), Symuler Fast Yellow 4400 (made by Dainippon Ink and Chemicals, Incorporated).

Pigment Yellow 17 (C.I. No. 21105)

Examples) Permanent Yellow GG02 (made by Clariant (Japan) K.K.), Symuler Fast Yellow 8GF (made by Dainippon Ink and Chemicals, Incorporated).

Pigment Yellow 155

Examples) Graphtol Yellow 3GP (made by Clariant (Japan) K.K.)

Pigment Yellow 180 (C.I. No. 21290)

Examples) Novoperm Yellow P-HG (made by Clariant (Japan) K.K.), PV Fast Yellow HG (made by Clariant (Japan) K.K.)

Pigment Yellow 139 (C.I. No. 56298)

Examples) Novoperm Yellow M2R 70 (made by Clariant (Japan) K.K.)

5) Magenta Pigment

Pigment Red 57:1 (C.I. No. 15850:1)

Examples) Graphtol Rubine L6B (made by Clariant (Japan) K.K.), Lionol Red 6B-4290G (made by TOYO INK MFG. Co., Ltd.), Irgalite Rubine 4BL (made by Ciba Specialty Chemicals Inc.), Symuler Brilliant Carmine 6B-229 (made by Dainippon Ink and Chemicals, Incorporated).

Pigment Red 122 (C.I. No. 73915)

Examples) Hosterperm Pink E (made by Clariant (Japan) K.K.), Lionogen Magenta 5790 (made by TOYO INK MFG. Co., Ltd.), Fastogen Super Magenta RH (made by Dainippon Ink and Chemicals, Incorporated).

Pigment Red 53:1 (C.I. No. 15585:1)

Examples) Permanent Lake Red LCY (made by Clariant (Japan) K.K.), Symuler Lake Red C conc (made by Dainippon Ink and Chemicals, Incorporated).

Pigment Red 48:1 (C.I. No. 15865:1)

Examples) Lionol Red 2B 3300 (made by TOYO INK MFG. Co., Ltd.), Symuler Red NRY (made by Dainippon Ink and Chemicals, Incorporated).

Pigment Red 48:2 (C.I. No. 15865:2)

Examples) Permanent Red W2T (made by Clariant (Japan) K.K.), Lionol Red LX235 (made by TOYO INK MFG. Co., Ltd.), Symuler Red 3012 (made by Dainippon Ink and Chemicals, Incorporated).

Pigment Red 48:3 (C.I. No. 15865:3)

Examples) Permanent Red 3RL (made by Clariant (Japan) K.K.), Symuler Red 2BS (made by Dainippon Ink and Chemicals, Incorporated).

Pigment Red 177 (C.I. No. 65300)

Examples) Cromophtal Red A2B (made by Ciba Specialty Chemicals Inc.).

6) Cyan Pigment

Pigment Blue 15 (C.I. No. 74160)

Examples) Lionol Blue 7027 (made by TOYO INK MFG. Co., Ltd.), Fastogen Blue BB (made by Dainippon Ink and Chemicals, Incorporated).

Pigment Blue 15:1 (C.I. No. 74160)

Examples) Hosterperm Blue A2R (made by Clariant (Japan) K.K.), Fastogen Blue 5050 (made by Dainippon Ink and Chemicals, Incorporated).

Pigment Blue 15:2 (C.I. No. 74160)

Examples) Hosterperm Blue AFL (made by Clariant (Japan) K.K.), Irgalite Blue BSP (made by Ciba Specialty Chemicals Inc.), Fastogen Blue GP (made by Dainippon Ink and Chemicals, Incorporated).

Pigment Blue 15:3 (C.I. No. 74160)

Examples) Hosterperm Blue B2G (made by Clariant (Japan) K.K.), Lionol Blue FG7330 (TOYO INK MFG. Co., Ltd.), Cromophtal Blue 4GNP (made by Ciba Specialty Chemicals Inc.), Fastogen Blue FGF (made by Dainippon Ink and Chemicals, Incorporated).

Pigment Blue 15:4 (C.I. No. 74160)

Examples) Hosterperm Blue BFL (made by Clariant (Japan) K.K.), Cyanine Blue 700-10FG (made by TOYO INK MFG. Co., Ltd.), Irgalite Blue GLNF (made by Ciba Specialty Chemicals Inc.), Fastogen Blue FGS (made by Dainippon Ink and Chemicals, Incorporated).

Pigment Blue 15:6 (C.I. No. 74160)

Examples) Lionol Blue ES (TOYO INK MFG. Co., Ltd.)

Pigment Blue 60 (C.I. No. 69800)

Examples) Hosterperm Blue RL01 (made by Clariant (Japan) K.K.), Lionogen Blue 6501 (TOYO INK MFG. Co., Ltd.)

7) Black Pigment

Pigment Black 7 (carbon black C.I. No. 77266)

Examples) Mitsubishi Carbon Black MA100 (made by Mitsubishi Chemical Co., Ltd.), Mitsubishi Carbon Black #5 (made by Mitsubishi Chemical Co., Ltd.), Black Pearls 430 (made by Cabot Co.)

Moreover, with respect to the pigments that are applicable to the invention, appropriate commodities may be selected by reference to, for example, "GANRYO BINRAN, edited by Nihon Ganryo Gijutu Kyokai, published by SEIBUNDO SHINKOSHA PUBLISHING Co., Ltd., 1989", "COLOUR INDEX, THE SOCIETY OF DYES & COLOURIST, THIRD EDITION, 1987".

The average particle diameters of the above-mentioned dyes and pigments are normally not more than 5 μm, more preferably, not more than 1 μm. Upon manufacturing a color filter, the thickness thereof is preferably not more than 0.5 μm.

In addition to the above-mentioned components, the photosensitive resin composition preferably contains a thermal polymerization inhibitor. Examples of the thermal polymerization inhibitor include aromatic hydroxy compounds such as hydroquinone, p-methoxy phenol, p-t-butyl catechol, 2,6-di-t-butyl-p-cresol, β-naphthol, pyrogallol; quinones such as benzoquinone, p-toluquinone; amines such as naphthyl amine, pyridine, p-toluidine, phenothiazine; aluminum salt or ammonium salt of N-nitrosophenyl hydroxyl amine; chloranil, nitrobenzene, 4,4-thiobis(3-methyl-6-t-butylphenol), 2,2-methylenebis (4-methyl-6-t-butylphenol), and 2-mercaptobenzimidazole.

Known additives, such as a plasticizer, a surfactant other than the specific surfactants for use in the invention, an adhesion accelerator, a dispersant, a plasticizer, an anti-sag inhibitor, a leveling agent, an antifoamer, a flame retarder, a brightener and solvent, may be added to the photosensitive resin composition, if necessary.

With respect to the adhesion accelerator, examples thereof include: alkyl phenol/formaldehyde novolak resin, polyvinyl ethyl ether, polyvinyl isobutyl ether, polyvinyl butyral, polyisobutylene, styrene-butadiene copolymer rubber, butyl rubber, vinyl chloride-vinyl acetate copolymer, chlorinated rubber, acrylic resin-based self-adhesive, aromatic, aliphatic or alicyclic oil resin and silane coupling agent.

The thickness of the photosensitive resin layer formed by the photosensitive resin composition is preferably in a range of 0.5 to 10 μm, more preferably, 1 to 5 μm.

The photosensitive resin layer is obtained by dispersing a mixture of a coloring agent and a resin and then mixing other materials with the mixture.

(Preparation of an Image Forming Material)

An image forming material according to the invention is prepared by, for example, the following processes: the above-mentioned support is coated with a coating solution for an alkali-soluble thermoplastic resin layer and dried to form a thermoplastic resin layer, and a coating solution for a photosensitive resin layer that does not dissolve the thermoplastic resin layer is applied onto the thermoplastic resin layer and dried to form a photosensitive resin layer. An oxygen-blocking layer may be placed between the thermoplastic resin layer and the photosensitive resin layer. For example, the image forming material may be prepared by another method in which: a thermoplastic resin layer is formed on a support, and a coating solution an oxygen-blocking-layer comprising a solvent that does not dissolve the thermoplastic resin layer is applied thereon and dried to form an oxygen-blocking layer, and onto the oxygen-blocking layer, a coating solution for a photosensitive-resin-layer is applied, using a solvent that does not dissolve the oxygen-blocking layer, and dried to form a photosensitive resin layer. Alternatively, a photosensitive resin layer is formed on a coating sheet, which will be described later, while a thermoplastic resin layer and an oxygen-blocking layer are formed on a support, and the layers are attached so that the oxygen-blocking layer and the photosensitive resin layer come into contact with each other. Alternatively, a photosensitive resin layer and an oxygen-blocking layer are formed on a coating sheet, while a thermoplastic resin layer is formed on a support, and the layers are attached so that the oxygen-blocking layer and the photosensitive resin layer come in contact with each other, in the same manner as described above.

The above-mentioned alkali-soluble thermoplastic resin layer, oxygen-blocking layer and photosensitive resin layer are formed by applying coating solutions for the respective layers (normally, with the composition being dissolved in an organic solvent), employing known methods. For example, coating machines, such as a spinner, a whirler, a roller coater, a curtain coater, a knife coater, a wire-bar coater and an extruder, may be used for applying the coating solutions for the respective layers, and the coated solutions are dried to give the respective layers.

With respect to solvents to be used for forming the coating solutions for the respective layers, examples thereof include methylethyl ketone, propylene glycol monomethyl ether, propylene glycol monomethyl ether acetate, cyclohexanone, cyclohexanol, ethyl lactate, methyl lactate and caprolactam.

A thin coating sheet is preferably formed on the photosensitive resin layer so as to protect it from contamination and damages upon storage. The coating sheet may be made of the same or similar material as that of the support, and is easily separated from the photosensitive resin layer. With respect to the material to be used as the coating sheet, for example, silicone paper, polyolefin sheets or polytetrafluoroethylene sheets are preferably used. The thickness of the coating sheet is normally 5 to 100 μm, more preferably, 10 to 30 μm.

Normally, when the support is separated from the other part of the image forming material, which is attached to a permanent support such as a grass substrate, the charged support (film) tends to give an unpleasant electric shock to the human body, and dusts tend to adhere to the charged support. For this reason, it is preferable to form a conductive layer on the support, or to carry out a process for implanting an electronic conductivity in the support. Moreover, in the case when the conductive layer is formed on the opposite side of the support (on the side without the photosensitive resin layer), a hydrophobic polymer layer is preferably formed so as to improve the scratch resistant property.

A multi-color image sheet, such as a color filter, is manufactured by using the image forming material of the invention, for example, in the following manner. In the formation of the respective pixels of red, green and blue, a photosensitive resin layer sensitive to red is transferred onto a substrate surface by using the image forming material having a photosensitive resin layer sensitive to red which is used for red pixel forming, an imagewise exposing process is carried out to the photosensitive resin layer and the resultant image is developed to form a red pixel, and the similar processes are carried out to form green and blue pixels. Upon arranging the three kinds of pixels of red, green and blue, any arrangement may be adopted, and the examples include mosaic-type, triangle-type and four-pixel alignment-type arrangements.

A portion of black-color photosensitive resin layer corresponding to the upper face of respective pixels and gap areas between pixels, are transferred on the substrate surface by using the image forming material having the black-color photosensitive resin layer, and the transferred portion is exposed from the back face (from the side without the pixels) and developed to form a black matrix. The image sheet is heated so that the uncured portion is cured (separately for each of the pixels).

The attachment process of the image forming material of the invention to the substrate surface is generally carried out in the following manner. After the coating sheet on the photosensitive resin layer of the image forming material has been removed, the image forming material is superposed on the substrate surface and the attachment process is carried out being pressurized and heated. In the attachment, any known laminator, such as a laminator, a vacuum laminator and an autocutter laminator, which can improve productivity, may be used. Then, after the support has been separated and removed, the photosensitive resin layer is exposed through a predetermined mask, the thermoplastic resin layer and oxygen-blocking layer, then, the unexposed area is removed (developing process). A light source to be used in the above-mentioned exposure is appropriately selected in accordance with the photosensitivity of the photosensitive resin layer. For example, any known means, such as an ultra-high pressure mercury lamp, a xenon lamp, a carbon-arc lamp, and an argon laser may be used. As described in JP-A No. 6-59119, an optical filter or the like, which has a light transmittance of not more than 2% in a wavelength range of not less than 400 nm, may be used in combination.

As the developer of the photosensitive resin layer, a diluted aqueous solution of an alkali substance is used. Further, a solution to which an organic solvent miscible to water is slightly added may be used. Examples of the appropriate alkali substances include alkali metal hydroxides (for example, sodium hydroxide, potassium hydroxide), alkali metal carbonates (for example, sodium carbonate, potassium carbonate), alkali metal bicarbonates (for example, sodium hydrogencarbonate, potassium hydrogencarbonate), alkali metal silicates (for example, sodium silicate, potassium silicate), alkali metal meta silicates (for example, sodium meta silicate, potassium meta silicate), triethanol amine, diethernol amine, monoethernol amine, morpholine, tetraalkylammonium hydroxides (for example, tetramethylammonium hydroxide) and trisodium phosphate. The concentration of the alkali substance is preferably 0.01 to 30% by mass, and the pH is preferably 8 to 14.

Examples of appropriate organic solvents miscible to water include methanol, ethanol, 2-propanol, 1-propanol, butanol, diacetone alcohol, ethylene glycol monomethyl ether, ethylene glycol monoethyl ether, ethylene glycol mono n-butyl ether, benzyl alcohol, acetone, methylethyl ketone, cyclohexanone, $\epsilon$-caprolactone, $\gamma$-butyrolactone, dimethyl formamide, dimethyl acetamide, hexamethyl phosphor amide, ethyl lactate, methyl lactate, $\epsilon$-caprolactam and N-methyl pyrrolidone. The concentration of the organic solvent miscible with water is generally 0.1 to 40% by mass.

Moreover, a known surfactant may be added to the developer.

The developer may be used as a bath liquid or a spray liquid. In order to remove the uncured portion of the photosensitive resin layer, a method in which the layer is rubbed with a rotary brush or a wet sponge in the developer or a method in which a spraying pressure at the time of spraying the developer is utilized may be used on demand. The liquid temperature of the developer is normally in a range of from a temperature near room temperature to 40° C. After the developing process, the layer may be subjected to a washing process with water. Moreover, in the developing process, the alkali-soluble thermoplastic resin layer, the oxygen-blocking layer and the photosensitive resin layer may be treated in one lot, however, in order to minimize developing irregularities and degradation in the photosensitive resin layer due to the developer upon developing, the developing process of the photosensitive resin layer is preferably carried out after the alkali-soluble thermoplastic resin layer and the oxygen-blocking layer have been preliminarily dissolved and removed. In the case when the developing process of the photosensitive resin layer is carried out after removing the alkali-soluble thermoplastic resin layer and the oxygen-blocking layer, the developer to be used for removing the alkali-soluble thermoplastic resin layer and the oxygen blocking layer are preferably selected so as not to cause degradation of the photosensitive resin layer. This method is achieved by selecting the developer while taking into consideration a difference in the dissolving speed between both of the alkali-soluble thermoplastic resin layer and the oxygen-blocking layer, and the photosensitive resin layer, or appropriately combining developing process conditions such as the temperature of the developer, spraying pressure and rubbing pressure. With this method, it is possible to reduce developing irregularities.

After the developing process, a heating process is carried out. In other words, the support having the photosensitive resin layer that has been photo-cured by exposure is heated in an electric furnace or a drying device, or the photosensitive resin layer is heated by irradiation with an infrared lamp. The heating temperature and time vary depending on the composition, thickness, etc. of the photosensitive resin layer. However, in general, the heating temperature is preferably in a range of approximately 120 to 250° C. with the heating time of approximately 10 to 300 minutes in order to obtain sufficient solvent resistance and alkaliproof.

Basically, the image forming material of the invention is advantageously used for forming multi-color images of a color filter and the like. In addition, it is also applicable to an interlayer insulating film, a printed circuit board, an intaglio/relief printing plate, a name plate, a color proof, an offset printing plate, a screen printing stencil and the like. Upon manufacturing a printed circuit board, a known copper-clad laminate is normally used as its substrate.

EXAMPLES

The following description will further discuss the invention referring to examples. However, the invention is by no means limited by these examples. Here, in the following description, "parts" designates "mass parts" and "%" designates to "mass %", unless otherwise indicated.

Example 1

Onto a temporary support of a polyethylene terephthalate film having a thickness of 75 μm was applied a coat solution having the following formulation Cu1, and dried thereon to form a thermoplastic resin layer having a dry film thickness of 20 μm.

| Thermoplastic resin layer formulation Cu1: | |
|---|---|
| Methyl methacrylate/2-ethyl hexyl acrylate/benzyl methacrylate/methacrylic acid copolymer (Copolymer composition ratio (molar ratio) = 55/30/10/5, Weight-average molecular weight = 100,000, Tg ≈ 70° C.) | 5.8 parts |
| Styrene/acrylic acid copolymer (Copolymer composition ratio (molar ratio) = 65/35, Weight-average molecular weight = 10,000, Tg ≈ 100° C.) | 13.2 parts |
| Compound formed by dehydration-condensation of 2 equivalents of pentaethylene glycol monomethacrylate with bisphenol A (BPE-500 made by Shin-Nakamura Chemical Co., Ltd.) | 9 parts |
| Methylethyl ketone | 53 parts |
| Methanol | 17 parts |
| Copolymer of the invention shown in Table 1 (20% by weight solution in methylisobutyl ketone) | 0.55 part |

Evaluation of Coating Property

The composition Cu1 solution was applied, and the coated state was visually observed and evaluated based upon the following criteria. The practically applicable level is level CC or better. Table 2 shows the results thereof.

AA: Edge portion was evenly coated to exhibit superior coating properties.

BB: Although edge portion was thickly coated slightly, no problem was raised and coating property was good.

CC: Although edge portion was thickly coated slightly and slight winding was observed, no problem was raised and coating property was normal.

DD: Edge portion was thickly coated and winding, causing inferior coating property.

EE: Edge portion was hardly coated, causing extremely inferior coating property.

Next, a coating solution having the following formulation PC1 was prepared, and applied and dried to provide an intermediate layer having a dry film thickness of 1.6 μm.

| Intermediate layer composition PC1: | |
|---|---|
| PVA205 (polyvinyl alcohol made by Kuraray Co., Ltd., saponification degree = 88%, polymerization degree 550) | 100 parts |
| Polyvinyl pyrrolidone (PVP, K-30 made by GAF Corp.) | 50 parts |
| Distilled water | 1850 parts |
| Methanol | 1000 parts |

TABLE 1

| | Monomer (a) *1 | | | Monomer (b-1) *2 | | | | | Monomer (b-2) *2 | | | | | Copolymerization ratio | Mass-average molecular | Amount of |
|---|---|---|---|---|---|---|---|---|---|---|---|---|---|---|---|---|
| | $R^1$ | n | m | $R^2$ | p | q | $R^3$ | $R^4$ | $R^2$ | p | q | $R^3$ | $R^4$ | (a):(b-1):(b-2) | weight | addition |
| Example 1 | H | 2 | 6 | H | 7 | 0 | $CH_3$ | H | H | 0 | 7 | H | H | 40:55:5 | 30000 | 1.09 |
| Example 2 | H | 2 | 6 | H | 7 | 0 | $CH_3$ | H | H | 0 | 7 | H | H | 40:40:20 | 30000 | 1.09 |
| Example 3 | H | 2 | 6 | H | 7 | 0 | $CH_3$ | H | | | | | | 40:60:0 | 30000 | 1.09 |
| Example 4 | H | 2 | 6 | H | 7 | 0 | $CH_3$ | H | H | 0 | 7 | H | H | 25:60:15 | 30000 | 1.09 |
| Example 5 | H | 2 | 6 | H | 7 | 0 | $CH_3$ | H | H | 0 | 7 | H | H | 60:25:15 | 30000 | 1.09 |
| Example 6 | H | 2 | 6 | H | 7 | 0 | $CH_3$ | H | H | 0 | 7 | H | H | 40:55:5 | 5000 | 1.09 |
| Example 7 | H | 2 | 6 | H | 7 | 0 | $CH_3$ | H | H | 0 | 7 | H | H | 40:55:5 | 30000 | 0.55 |
| Example 8 | H | 2 | 6 | H | 6 | 1 | $CH_3$ | H | | | | | | 40:60:0 | 30000 | 1.09 |
| Example 9 | H | 2 | 6 | H | 1 | 6 | $CH_3$ | H | | | | | | 40:60:0 | 30000 | 1.09 |
| Example 10 | $CH_3$ | 2 | 6 | H | 7 | 0 | $CH_3$ | H | H | 0 | 7 | H | $CH_3$ | 40:55:5 | 30000 | 1.09 |
| Example 11 | H | 2 | 6 | H | 7 | 0 | $CH_3$ | $CH_3$ | H | 0 | 7 | H | H | 40:55:5 | 30000 | 1.09 |
| Example 12 | H | 2 | 6 | $CH_3$ | 7 | 0 | $CH_3$ | H | $CH_3$ | 0 | 7 | H | H | 40:55:5 | 30000 | 1.09 |
| Example 13 | H | 2 | 12 | H | 7 | 0 | $CH_3$ | H | H | 0 | 7 | H | H | 40:55:5 | 30000 | 1.09 |
| Example 14 | H | 2 | 4 | H | 7 | 0 | $CH_3$ | H | H | 0 | 7 | H | H | 40:55:5 | 30000 | 1.09 |
| Example 15 | H | 2 | 6 | H | 14 | 0 | $CH_3$ | H | H | 0 | 7 | H | H | 40:55:5 | 30000 | 1.09 |
| Example 16 | H | 2 | 6 | H | 7 | 0 | $CH_3$ | H | H | 0 | 14 | H | H | 40:55:5 | 30000 | 1.09 |
| Comparative Example 1 | | | | | | | | | Not added | | | | | | | 0 |
| Comparative Example 2 | | | | | | | | | *3 | | | | | | | 1.64 |
| Comparative Example 3 | H | 2 | 6 | H | 7 | 0 | H | H | H | 0 | 7 | H | H | 15:60:25 | 30000 | 1.09 |

(Note)
*1 Monomer (a) represents a monomer in which $R^1$, n and m in general formula (a) are a group or values indicated in Table 1.
*2 Each of monomers (b-1) and (b-2) represents a monomer in which $R^2$, $R^3$, $R^4$, p and q in general formula (b) are groups or values indicated by Table 1.
*3 Copolymer of 60% by weight of $C_8F_{17}SO_2N(C_4H_9)CH_2CH_2OCOCH=CH_2$ and 40% by weight of $H(O(CH_3)CHCH_2)_6OCOCH=CH_2$ (mass-average molecular weight: 30,000; solids content: 20%)

Evaluation of Anti-Peeling Property of Intermediate Layer

The surface of a temporary support having the above-mentioned thermoplastic resin layer and intermediate layer was visually observed, or observed by a microscope so that evaluation was made based upon the following criteria:

The practically applicable level is level CC or better. Table 2 shows the results thereof.

AA: The surface of an intermediate layer was evenly formed without any peeling, and anti-peeling property was very good.

BB: Although pressuring marks were slightly observed on the surface of the intermediate layer, no peeling occured and anti-peeling property was good.

CC: Although peeling slightly occured only in the edge portion, no problem was observed as to the other portions, and anti-peeling property was normal.

DD: Peeling occured not only in the edge portion, but also in the other portions slightly, and anti-peeling property was bad.

EE: Peeling occured over the entire surface, and anti-peeling property was very poor.

Photosensitive solutions of four colors of R, G, B and K were applied onto four temporary supports, each having the above-mentioned thermoplastic resin layer and the intermediate layer, and these were dried to form colored photosensitive resin layers having a dry film thickness of 2 μm.

Preparation of Red Pigment Dispersion

Preparation of PR254 Dispersion 1

The following formulation was subjected to a pigment dispersing process through the following sequence by using a beads dispersing machine.

Pigment dispersant 1 was put into MMPG-AC while being stirred, and PR254 pigment powder and a benzyl methacrylate/methacrylic acid copolymer were then put into this, and stirred.

This mixture was dispersed for four hours while being circulated by using the beads dispersing machine (zirconia beads 0.3 mm). Further, MMPC-AC was added to this to obtain PR254 dispersion 1 having a solids content of 16.8%.

| Formulation of PR254 dispersion 1: | |
| --- | --- |
| The following pigment dispersant 1 | 10 parts |
| MMPG-AC (Propylene glycol monomethyl ether acetate) | 790 parts |
| PR254 | 100 parts |
| Benzyl methacrylate/methacrylic acid copolymer (Molar ratio = 73/27, molecular weight 30,000) | 100 parts |

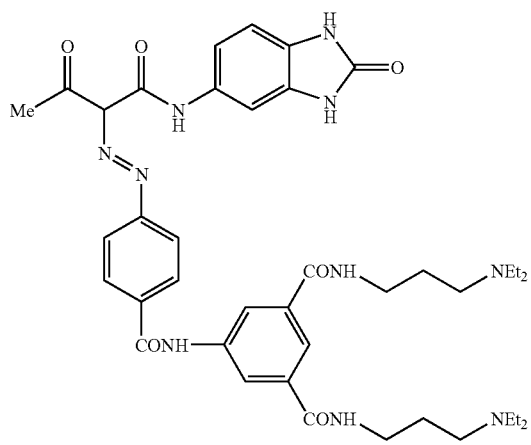

Pigment dispersant 1

Preparation of PR254 Dispersion 2

With respect to a dispersion having the following composition, pigment dispersant 2 was put into propylene glycol monomethyl ether acetate while being stirred, and PR254 pigment powder was put into this, and stirred. This mixture was dispersed for four hours while being circulated by using the beads dispersing machine (zirconia beads 0.3 mm) to prepare a pigment dispersion.

| Formulation of PR254 dispersion 2: | |
| --- | --- |
| The following pigment dispersant 2 | 16 parts |
| MMPG-AC (Propylene glycol monomethyl ether acetate) | 931 parts |
| PR254 | 53.3 parts |

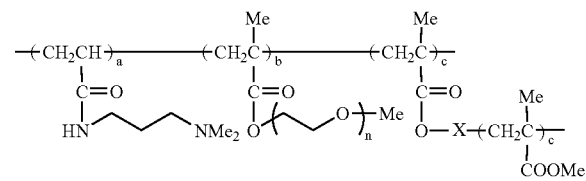

Pigment dispersant 2 n = 23
a:b:c = 15:20:65

Formulation of Coating Solution for Photosensitive Layer

| Red resist coating solution: | |
| --- | --- |
| PR254 dispersion 1 | 18.0 parts |
| PR254 dispersion 2 | 17.9 parts |

-continued

| | |
|---|---|
| 7240M (made by Mikuni Color Ltd.,) | 0.09 part |
| MMPG-AC (Propylene glycol monomethyl ether acetate) | 16.5 parts |
| Methylethyl ketone | 35.0 parts |
| Cyclohexane | 2.60 parts |
| Benzylmethacrylate/methacrylic acid copolymer (Copolymerization ratio = 72/28, molecular weight 30,000) | 1.10 parts |
| Benzylmethacrylate/methacrylic acid/ hydroxylethyl methacrylate copolymer (Copolymerization ratio = 71/12/17, molecular weight 40,000) | 0.754 part |
| Dipentaerythritol hexacrylate | 3.46 parts |
| 2-trichloromethyl-5-(p-styrylstyryl)-1,3,4-oxadiazole | 0.30 part |
| 7-{[-4(diethyl amino)-6-(3-hydroxymethyl piperidino)-s-triazinyl(2)]-amino}-3-phenyl coumarin | 1.13 parts |
| 7-{[-4-chloro-6-(diethyl amino)-s-triazinyl(2)]-amino}-3-phenyl coumarin | 1.13 parts |
| Copolymer of the invention used in thermoplastic resin layer composition Cu1 (30% by weight solution in methylisobutyl ketone) | 0.026 part |
| Phenothiazine | 0.0108 part |

Preparation of Green Pigment Dispersion (Preparation of PG36 Dispersion)

In accordance with the following formulation, pigment dispersant 1 was put into MMPG-AC while being stirred, and PG36 pigment powder and benzylmethacrylate/methacrylic acid copolymer were put into this, and stirred. This mixture was dispersed for four hours while being circulated by using a beads dispersing machine (zirconia beads 0.3 mm) to prepare a pigment dispersion.

| Formulation of PG36 dispersion: | |
|---|---|
| The above-mentioned pigment dispersant 1 | 14 parts |
| MMPG-AC (Propylene glycol monomethyl ether acetate) | 808 parts |
| PG36 | 140 parts |
| Benzylmethacrylate/methacrylic acid copolymer (Copolymerization ratio = 73/27, molecular weight 30,000) | 37.8 parts |

Preparation of PY138 Dispersion

In accordance with the following formulation, pigment dispersant 1 was put into propylene glycol monomethyl ether acetate while being stirred, and PY138 pigment powder and benzylmethacrylate/methacrylic acid copolymer were put into this, and stirred. This mixture was dispersed for four hours while being circulated by using a beads dispersing machine (zirconia beads 0.3 mm) to prepare a pigment dispersion.

| Formulation of PY138 dispersion: | |
|---|---|
| The above-mentioned pigment dispersant 1 | 9.0 parts |
| MMPG-AC (Propylene glycol monomethyl ether acetate) | 811 parts |
| PY138 | 90 parts |
| Benzylmethacrylate/methacrylic acid copolymer (Copolymerization ratio = 73/27, molecular weight 30,000) | 90 parts |
| Green resist coating solution: | |
| PG36 dispersion | 20.7 parts |
| PY138 dispersion | 16.2 parts |
| MMPG-AC (Propylene glycol monomethyl ether acetate) | 5.92 parts |
| Methylethyl ketone | 51.60 parts |

-continued

| Formulation of PY138 dispersion: | |
|---|---|
| Benzylmethacrylate/methacrylic acid/ hydroxyl ethyl methacrylate copolymer (Copolymerization ratio = 71/12/17, molecular weight 40,000) | 0.501 part |
| Dipentaerythritol hexacrylate | 31.9 parts |
| 2-trichloromethyl-5-(p-styrylstyryl)-1,3,4-oxadiazole | 0.106 part |
| 7-{[-4-chloro-6-(diethyl amino)-s-triazinyl(2)]-amino}-3-phenyl coumarin | 0.980 part |
| 2,4-bis(trichloromethyl-6-[4-(N,N-diethoxycarbonyl methyl) amino-3-bromophenyl]-s-triazine | 0.106 part |
| Phenothiazine | 0.0043 part |
| Copolymer of the invention used in thermoplastic resin layer composition Cu1 (30% by weight solution in methylisobutyl ketone) | 0.0621 part |

Preparation of PB 15:6 Dispersion

In accordance with the following formulation, DISPARLON DA-725 and EFKA-6745 were put into MMPG-AC while being stirred, and PB15:6 pigment powder and benzylmethacrylate/methacrylic acid copolymer were put into this, and stirred. This mixed solution was dispersed for four hours while being circulated by using a beads dispersing machine (zirconia beads 0.3 mm) to prepare a pigment dispersion.

| Formulation of PB15:6 dispersion: | |
|---|---|
| DISPARLON DA-725 (made by Kusumoto Chemicals, Ltd.) | 6.25 parts |
| EFKA-6745 (made by EFKA additives) | 5.0 parts |
| MMPG-AC (Propylene glycol monomethyl ether acetate) | 764 parts |
| PB 15:6 (made by C.I.) | 100 parts |
| Benzylmethacrylate/methacrylic acid copolymer (Molar ratio = 73/27, molecular weight 30,000) | 125 parts |
| Blue resist coating solution: | |
| PB 15:6 dispersion | 30.0 parts |
| MMPG-AC (Propylene glycol monomethyl ether acetate) | 12.0 parts |
| Methylethyl ketone | 52.50 parts |
| Benzylmethacrylate/methacrylic acid/ hydroxyl ethyl methacrylate copolymer (Copolymerization ratio = 71/12/17, molecular weight 40,000) | 1.14 parts |
| Dipentaerythritol hexacrylate | 3.89 parts |
| 2-trichloromethyl-5-(p-styrylstyryl)-1,3,4-oxadiazole | 0.199 part |
| 2,4,6-tris[2,4bis(methoxycarbonyloxy) phenyl]-1,3,5-triazine | 0.188 part |
| Phenothiazine | 0.022 part |
| Copolymer of the invention used in thermoplastic resin layer composition Cu1 (30% by weight solution in methylisobutyl ketone) | 0.093 part |
| Black resist coating solution: | |
| CFP-FF-775B (C.I. PB15:6 dispersion made by Fujifilm Olin Co., Ltd.) | 4.50 parts |
| CFP-FF-293Y (C.I. PY139 dispersion made by Fujifilm Olin Co., Ltd.) | 3.37 parts |
| CFP-FF-802V (C.I. PV23 dispersion made by Fujifilm Olin Co., Ltd.) | 4.16 parts |
| CFP-FF-949K (Carbon Black dispersion made by Fujifilm Olin Co., Ltd.) | 11.9 parts |
| MMPG-AC (Propylene glycol monomethyl ether acetate) | 18.9 parts |
| Methylethyl ketone | 52.0 parts |
| Hydroquinone monomethyl ether | 0.0022 part |
| Dipentaerythritol hexacrylate | 4.85 parts |
| Bis[4-[N-[4-(4,6-bistrichloromethyl-s-triazine-2-yl) phenyl] carbamoyl] phenyl] sebacate | 0.238 part |
| Copolymer of the invention used in thermoplastic resin layer composition Cu1 (30% by weight solution in methylisobutyl ketone) | 0.065 part |

Moreover, a coating sheet (thickness: 12 μm) was press-bonded onto the above-mentioned photosensitive resin layer to form each of red, blue, green and black image forming materials.

By using these image forming materials, a color filter was formed according to the following method. The coating sheet of the red image forming material was peeled, and the surface of the photosensitive resin layer was heated (130° C.) and pressed (10 kg/cm) onto a transparent glass substrate (thickness: 1.1 mm) by using a laminator (VP-II made by Taisei-Laminator K.K. so as to be attached onto the glass substrate (speed: 0.7 m/min.)

Evaluation of Transferring Property

With respect to the transferring property, inclusion of bubbles at the time of the above-mentioned laminating process by the laminator was observed and evaluated based upon the following five levels, that is, AA, BB, CC, DD, EE.

The practically applicable level is level CC or better. Table 2 shows the results thereof.

AA: No inclusion of bubbles occured and a transferring property was very good.

BB: Although bubbles were slightly included in four corners of the substrate that were non-display portions, no bubbles were included in the other portions providing a good transferring property.

CC: Although bubbles were slightly included in four sides of the substrate that were non-display portions, no bubbles were included in the other portions providing a normal transferring property.

DD: Bubbles were slightly included in display portions to cause a bad transferring property.

EE: Bubbles were included in the entire surface to cause a very bad transferring property.

Evaluation of Separating Property of the Temporary Support

The bonded image forming materials were separated from each other along the interface between the temporary support and the thermoplastic resin layer so that the temporary support was removed. The surface of the temporary support and the transferred uppermost layer were visually observed, or observed by using a microscope so that evaluation was made in the following manner.

The practically applicable level is level CC or better. Table 2 shows the results thereof.

AA: The separated surface was even without any traces, and the separating property was very good.

BB: Although dot-like separation traces were slightly observed in edge portions of the temporary support, no separations were observed in the other portions and the separating property was good.

CC: Although line-shaped separation traces were observed in edge portions of the temporary support, no separations were observed in the other portions, and the separating property was normal.

DD: Separation traces were observed slightly not only in edge portions, but also in the other portions, resulting in a bad separating property.

EE: Separation traces were observed on the entire surface to cause an extremely bad separating property.

Next, the material was exposed through a predetermined photomask, and the thermoplastic resin layer and the intermediate layer were dissolved and removed with a 1% triethanol amine aqueous solution. The shortest removing time required for the complete removal of these layers was 30 seconds. Next, the photosensitive resin layer was developed by a 1% sodium carbonate aqueous solution to remove unnecessary portions so that a red pixel pattern was formed on the glass substrate. Successively, a green image forming material was attached onto the glass substrate on which the red pixel pattern had been formed, in the same manner as described above, and the separating, exposing and developing processes were carried out to form a green pixel pattern. The same processes were repeated with respect to the blue and black image forming materials to form a color filter on the transparent glass substrate.

Formation of Color Filter

The coating sheet of the resulting image forming material was separated and removed, and the photosensitive red resin layer surface was heated (130° C.) at a velocity of 10 m/min, and pressed (10 kg/cm$^2$)($\approx$980 kPa) onto a transparent glass substrate (thickness: 1.1 mm) by using a laminator (VP-II made by Taisei-Laminator K.K.) so as to be attached thereto, and the temporary support was separated from the thermoplastic resin layer along the interface between them so that the temporary support was removed.

Next, the photosensitive red resin layer was exposed by using an ultra-high pressure mercury lamp, through a photomask (a negative image with square pixels, the length of each side being 20 to 60 μm). The dose of exposure was set to 20 mJ/cm$^2$. Thereafter, the alkali-soluble thermoplastic resin layer was dissolved and removed in 30 seconds by using a 1% triethanol amine aqueous solution. Next, the photosensitive red resin layer was developed in a 1% sodium carbonate aqueous solution to remove the unexposed portions so that a red pixel (R) pattern was formed. The glass substrate having thereon the red pixels was heated at 220° C. for 130 minutes so that the pixel portions were sufficiently cured to form a color filter bearing only the red pixels.

Evaluation of Photosensitive Red Resin Layer of the Image Forming Material

The external appearance of the photosensitive red resin layer surface, the surface of the resultant photosensitive red resin layer of the image forming material and the surface of the color filter formed through the above-mentioned method were visually observed, or observed by using a microscope, and evaluated in the following manner.

The practically applicable level is level CC or better. Table 2 shows the results thereof.

AA: No color irregularities were observed.

BB: Color irregularities were observed only slightly

CC: Color irregularities were observed a little.

DD: A number of color irregularities were observed.

EE: Color irregularities were observed over the entire surface.

Examples 2 to 16

The same processes as example 1 were carried out except that, instead of "the copolymer of the invention shown in Table 1" in the formulation of the thermoplastic resin layer Cu1 of example 1, "the copolymers of the invention" in examples 2 to 16 respectively shown in Table 1 were used so that image forming materials of examples 2 to 16 were formed to prepare a color filter.

Example 17

The same processes as example 1 were carried out, except that, in place of the copolymer of the invention that was commonly used in the formulations of the coating solutions for respective photosensitive layers (red, green, blue, black) in example 1, a copolymer (weight average molecular weight: 30,000) of 60% of $C_8F_{17}SO_2N(C_4H_9)$ $CH_2CH_2OCOCH=CH_2$ and 40% of $H(O(CH_3)CHCH_2)_6OCOCH=CH_2$ was used, so that an image forming material was formed to prepare a color filter.

Example 18

Image forming materials were formed through the same processes as example 1, except that the respective formulations of the coating solutions for the photosensitive layers (red, green, blue and black) were changed to the following formulations.

Composition of coating solution for photosensitive layer

Red resist coating solution:

| | |
|---|---|
| RT-107 (C.I. PR254 dispersion made by Fujifilm Olin Co., Ltd.) | 15.7 parts |
| MMPG-AC (Propylene glycol monomethyl ether acetate) | 34.7 parts |
| Cyclohexanone | 5.56 parts |
| Methylethyl ketone | 34.7 parts |
| MEGAFACE F-176PF (made by Dainippon Ink and Chemicals, Incorporated) | 0.71 parts |
| Phenothiazine | 0.011 parts |
| Benzyl methacrylate/methacrylic acid copolymer (Copolymerization ratio = 72/28, molecular weight 30,000) | 3.69 parts |
| Dipentaerythritol hexacrylate | 3.65 parts |
| 2-trichloromethyl-5-(p-styrylstyryl)-1,3,4-oxadiazole | 0.307 part |
| 7-{[-4(diethyl amino)-6-(3-hydroxymethyl piperidino)-s-triazinyl(2)]-amino}-3-phenyl coumarin | 1.25 parts |
| 2,4,6-tris[2,4bis(methoxycarbonyloxy)phenyl]-1,3,5-triazine | 0.312 part |

Green resist coating solution:

| | |
|---|---|
| GT-2 (C.I. PG36 dispersion made by Fujifilm Olin Co., Ltd.) | 8.9 parts |
| YT-123 (C.I. PY138 dispersion made by Fujifilm Olin Co., Ltd.) | 8.4 parts |
| MMPG-AC (Propylene glycol monomethyl ether acetate) | 21.77 parts |
| Methylethyl ketone | 50.9 parts |
| MEGAFACE F-176PF (made by Dainippon Ink and Chemicals, Incorporated) | 0.143 part |
| Phenothiazine | 0.0055 part |
| Benzyl methacrylate/methacrylic acid copolymer (Copolymerization ratio = 72/28, molecular weight 30,000) | 5.00 parts |
| Dipentaerythritol hexacrylate | 4.07 parts |
| 2-trichloromethyl-5-(p-styrylstyryl)-1,3,4-oxadiazole | 0.293 part |
| 7-{[-4(diethyl amino)-6-(3-hydroxymethyl piperidino)-s-triazinyl(2)]-amino}-3-phenyl coumarin | 0.600 part |

Blue resist coating solution:

| | |
|---|---|
| 7075M (C.I. PB15:6 dispersion made by Mikuni Color Ltd.,) | 44.6 parts |
| MMPG-AC (Propylene glycol monomethyl ether acetate) | 3.4 parts |
| Cyclohexane | 8.90 parts |
| Methylethyl ketone | 40.0 parts |
| MEGAFACE F-176PF (made by Dainippon Ink and Chemicals, Incorporated) | 0.105 part |
| Phenothiazine | 0.016 part |
| Benzyl methacrylate/methacrylic acid copolymer (Copolymerization ratio = 78/22, molecular weight 40,000) | 1.54 parts |
| Dipentaerythritol hexacrylate | 2.79 parts |
| 2-trichloromethyl-5-(p-styrylstyryl)-1,3,4-oxadiazole | 0.179 part |

Black Resist Coating Solution:
the same as the black resist coating solution in example 1

Comparative Example 1

The same processes as example 1 were carried out in the same manner as example 1 except that "the copolymer of the invention shown in Table 1" in the formulation of the thermoplastic resin layer Cu1 of example 1 was not used; thus, an image forming material was formed.

Comparative Example 2

The same processes as example 1 were carried out except that, in place of "the copolymer of the invention shown in Table 1" in the thermoplastic resin layer formulation Cu1 of example 1, copolymer of 60% by weight of $C_8F_{17}SO_2N(C_4H_9)CH_2CH_2OCOCH=CH_2$ and 40% by weight of $H(O(CH_3)CHCH_2)_6OCOCH=CH_2$ (weight average molecular weight: 30,000) was used to form an image forming material.

Comparative Example 3

The same processes as example 1 were carried out except that, in place of "the copolymer of the invention shown in Table 1" in the thermoplastic resin layer formulation Cu1 of example 1, "the copolymer of the invention" of comparative example 3 shown in Table 1 was used, to form an image forming material of comparative example 3, thus, a color filter was formed.

TABLE 2

| | Results of evaluation | | | |
|---|---|---|---|---|
| | Transferring property | coating property | Intermediate layer separation | Color irregularities |
| Example 1 | AA-BB | BB | BB | BB |
| Example 2 | AA-BB | BB | BB | BB |
| Example 3 | BB | BB | BB | BB |
| Example 4 | AA-BB | BB-CC | AA-BB | BB-CC |
| Example 5 | BB-CC | AA-BB | CC | AA-BB |
| Example 6 | AA-BB | BB-CC | AA-BB | BB-CC |
| Example 7 | BB | BB | AA-BB | BB |
| Example 8 | AA-BB | BB | BB | BB |
| Example 9 | AA-BB | BB-CC | AA-BB | BB-CC |
| Example 10 | AA-BB | BB | BB | BB |
| Example 11 | BB | BB | BB | BB |
| Example 12 | AA-BB | BB | BB | BB |
| Example 13 | AA-BB | AA-BB | BB-CC | AA-BB |
| Example 14 | AA-BB | BB-CC | AA-BB | BB-CC |
| Example 15 | AA-BB | BB | BB | BB |
| Example 16 | AA-BB | BB | BB | BB |
| Example 17 | AA-BB | BB | BB | BB |
| Example 18 | AA-BB | BB | BB | BB |
| Comparative Example 1 | DD | EE | DD | EE |
| Comparative Example 2 | CC | BB | CC-DD | BB |
| Comparative Example 3 | BB | DD | AA-BB | DD |

The above-mentioned results show that in comparison with comparative examples, the examples using surfactants of the invention were superior in transferring property and Cu1 solution coating property, intermediate layer separation and color irregularities.

The image forming material of the invention has a virtually even thickness, and makes it possible to maintain the adhesive strength between the respective layers in a desired relative relationship, and also to provide a smooth surface. Therefore, when a color filter is formed by using this image forming material, the resultant pixels are free from color irregularities with a superior adhesive property to the substrate, and it is possible to form fine pixels. Moreover, in particular, the photosensitive resin composition of the invention is advantageously used for forming the above-mentioned sheet.

What is claimed is:

1. An image forming transfer material comprising at least an alkali-soluble thermoplastic resin layer, an oxygen blocking layer, and a photosensitive resin layer, which are removably coated on a flexible temporary support having a superior separating property from the alkali-soluble thermoplastic resin layer in this order, wherein the image forming material includes, in at least the thermoplastic resin layer and in the photosensitive resin layer, a copolymer comprising a monomer represented by the following general formula (a) and a monomer represented by the following general formula (b), a content ratio by mass of the monomer represented by general formula (a) to the monomer represented by general formula (b) is from 20/80 to 60/40:

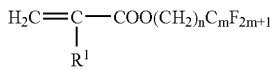

General formula (a)

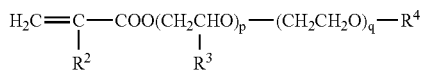

General formula (b)

in the formulae, each of R1, R2 and R3 independently represents a hydrogen atom or a methyl group, R4 represents a hydrogen atom or an alkyl group having 1 to 5 carbon atoms, n represents an integer of 1 to 18, m represents an integer of 2 to 14, each of p and q represents an integer of 0 to 18, however p and q cannot be 0 simultaneously, and wherein the thermoplastic resin layer is configured to separate from the flexible support upon transfer of the thermoplastic resin layer, the oxygen blocking layer and the photosensitive resin layer to a permanent substrate.

2. An image forming material according to claim 1, wherein a mass of the $C_mF_{2m+1}$ in the general formula (a) is in a range of 20 to 70% by mass with respect to the mass of the monomer represented by the general formula (a).

3. An image forming material according to claim 1, wherein m in the general formula (a) is in a range of 4 to 12.

4. An image forming material according to claim 1, wherein n in the general formula (a) is in a range of 2 to 10.

5. An image forming material according to claim 1, wherein each of p and q in the general formula (b) is in a range of 2 to 8.

6. An image forming material according to claim 1, wherein a weight average molecular weight Mw of the copolymer is in a range of 1000 to 40000.

7. An image forming material according to claim 1, wherein at least 2 types of monomers, different in at least one of molecular structure and monomer composition, are mixed and included in the copolymer.

8. An image forming material according to claim 1, wherein a vinyl-based monomer other than the monomer represented by the general formula (a) and the general formula (b) is included in the copolymer.

9. An image forming material according to claim 1, wherein the content of the copolymer is in a range of 0.01 to 10% by mass with respect to a total layer solids content of one of the thermoplastic resin layer and the photosensitive resin layer.

10. An image forming material according to claim 8, wherein in the copolymer, the monomer represented by the general formula (a) occupies a range of 20 to 60% by mass, the monomer represented by the general formula (b) occupies a range of 80 to 40% by mass, and the vinyl-based monomer occupies the rest.

11. An image forming material according to claim 1 wherein a protective coating sheet covers the photosensitive resin layer.

* * * * *